United States Patent
Larson

(10) Patent No.: US 8,861,556 B2
(45) Date of Patent: Oct. 14, 2014

(54) TUNABLE BRAGG GRATING AND A TUNABLE LASER DIODE USING SAME

(75) Inventor: Michael C. Larson, Oakland, CA (US)

(73) Assignee: JDS Uniphase Corporation, Milpitas, CA (US)

(*) Notice: Subject to any disclaimer, the term of this patent is extended or adjusted under 35 U.S.C. 154(b) by 148 days.

(21) Appl. No.: 13/542,547

(22) Filed: Jul. 5, 2012

(65) Prior Publication Data

US 2014/0010248 A1  Jan. 9, 2014

(51) Int. Cl.
 *H01S 3/10* (2006.01)

(52) U.S. Cl.
 USPC ......... 372/20; 372/50.11; 372/50.1; 372/102; 372/98

(58) Field of Classification Search
 USPC ........................... 372/20, 50.11, 50.1, 102, 98
 See application file for complete search history.

(56) References Cited

U.S. PATENT DOCUMENTS

| | | | |
|---|---|---|---|
| 4,885,753 A | 12/1989 | Okai et al. | 372/45 |
| 5,748,660 A * | 5/1998 | Delorme et al. | 372/50.11 |
| 7,778,295 B2 | 8/2010 | Matsui et al. | 372/34 |
| 7,848,599 B2 | 12/2010 | Cunningham et al. | 385/1 |
| 8,131,119 B2 | 3/2012 | Cunningham et al. | 385/1 |
| 2004/0228384 A1* | 11/2004 | Oh et al. | 372/96 |
| 2005/0053102 A1* | 3/2005 | Reid | 372/20 |
| 2007/0036188 A1* | 2/2007 | Fujii | 372/50.11 |
| 2007/0230523 A1* | 10/2007 | Ishikawa | 372/36 |
| 2007/0263694 A1* | 11/2007 | Fujii | 372/102 |
| 2008/0247707 A1* | 10/2008 | Fujii | 385/14 |
| 2009/0041073 A1 | 2/2009 | Matsui et al. | 372/34 |
| 2009/0074020 A1 | 3/2009 | Matsui et al. | 372/34 |
| 2010/0290736 A1* | 11/2010 | Cunningham et al. | 385/14 |
| 2010/0311195 A1* | 12/2010 | Matsui et al. | 438/31 |
| 2011/0235962 A1 | 9/2011 | Shubin et al. | 385/14 |

FOREIGN PATENT DOCUMENTS

| | | | |
|---|---|---|---|
| DE | 19629916 | 1/1997 | H01S 3/098 |
| EP | 1478064 | 11/2004 | H01S 5/0625 |
| EP | 1753104 | 2/2007 | H01S 5/125 |
| EP | 1804349 | 7/2007 | H01S 5/06 |
| EP | 1841023 | 10/2007 | H01S 5/026 |
| EP | 1978612 | 10/2008 | H01S 5/06 |
| GB | 2371920 | 8/2002 | H01S 5/12 |
| GB | 2378311 | 2/2003 | H01S 3/10 |

OTHER PUBLICATIONS

Search Report for European Application No. 12184980, dated Oct. 10, 2013.
Ishii et al. "Narrow spectral linewidth under wavelength tuning in thermally tunable super-structure grating (SSG) DBR lasers", IEEE Journal of Selected Topics in Quantum Electronics, vol. 1, No. 2 (1995), pp. 401-407.

* cited by examiner

*Primary Examiner* — Kinam Park
(74) *Attorney, Agent, or Firm* — George Y. Wang

(57) ABSTRACT

A spatially modulated waveguide Bragg grating mirror is suspended over a substrate by plurality of fingers extending laterally away from the waveguide centerline. The positions of the fingers are coordinated with the positions of crests and valleys of amplitude or phase modulation of the Bragg grating, to avoid disturbing the Bragg grating when it is tuned by heating. When the Bragg grating is heated, the heat flows through the fingers creating a quasi-periodic refractive index variation along the Bragg grating due to quasi-periodic temperature variation created by the heat flow from the grating through the supporting fingers. Due to coordination of the positions of supporting fingers with positions of the crests and valleys of modulation, the optical phase coherence is maintained along the Bragg grating, so that the spectral lineshape or filtering property of the Bragg grating is substantially preserved.

21 Claims, 13 Drawing Sheets

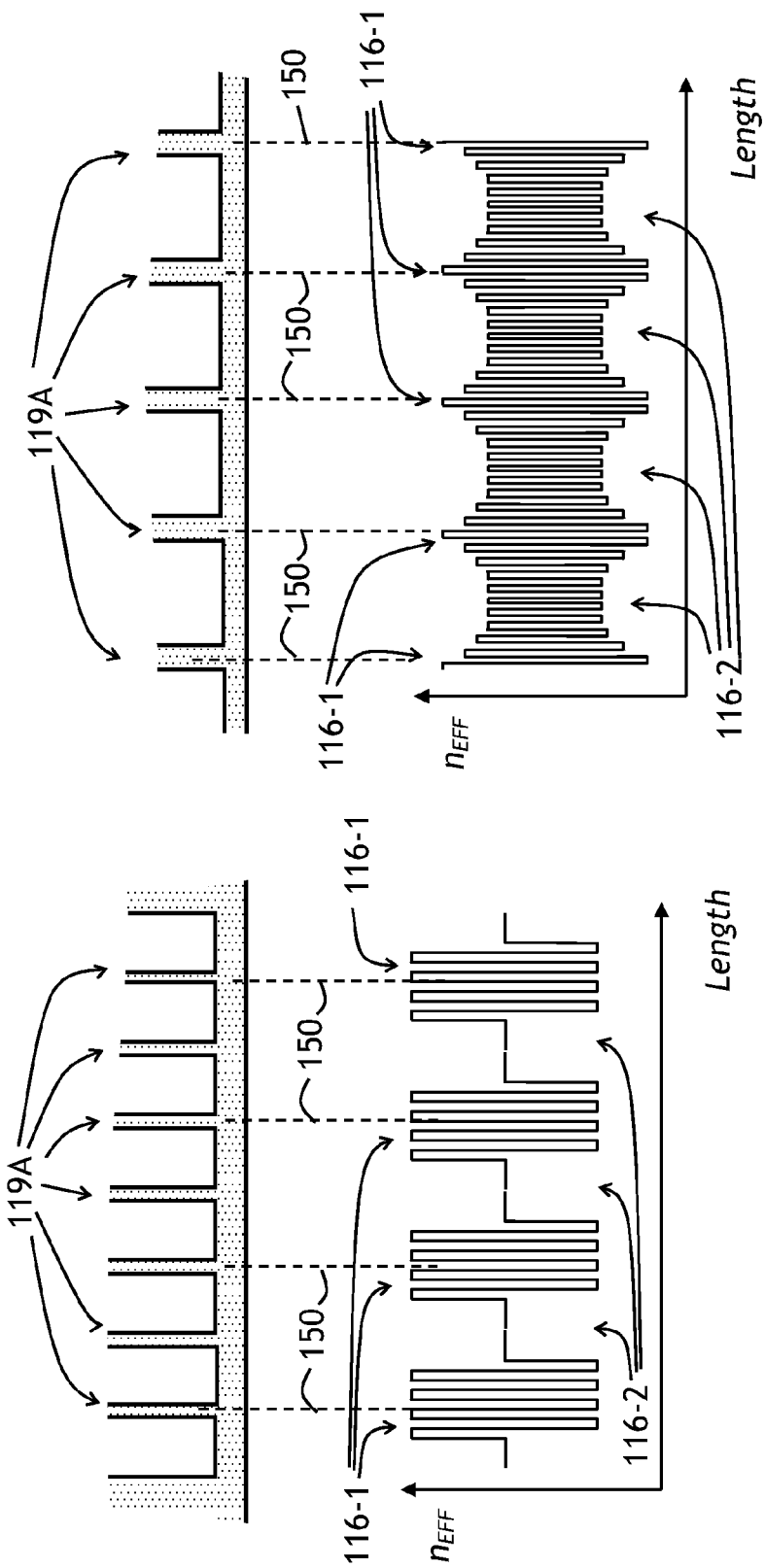

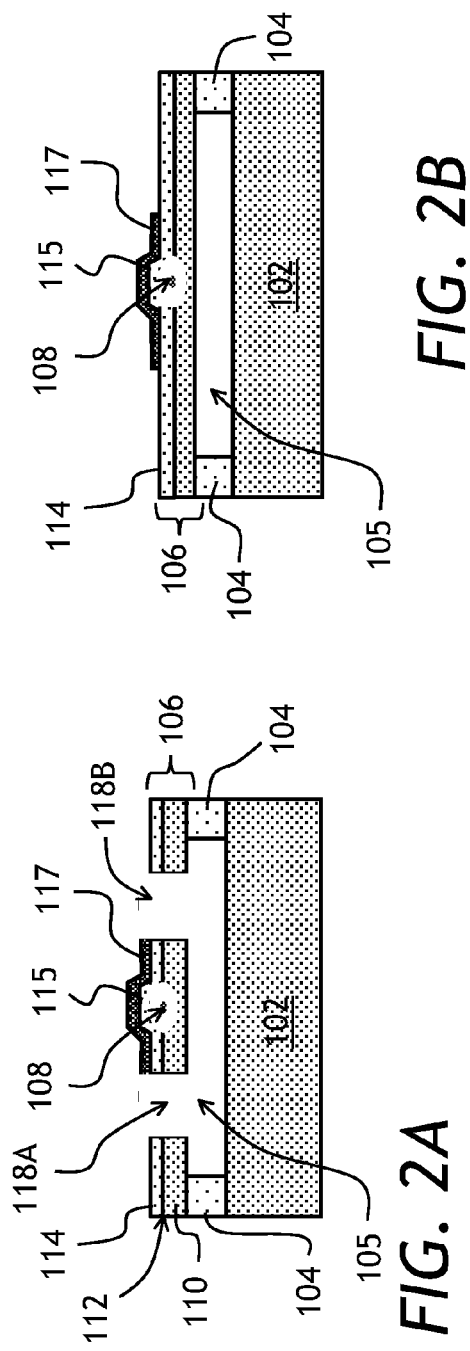
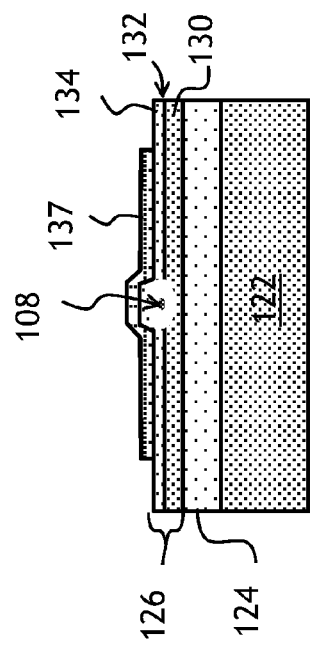

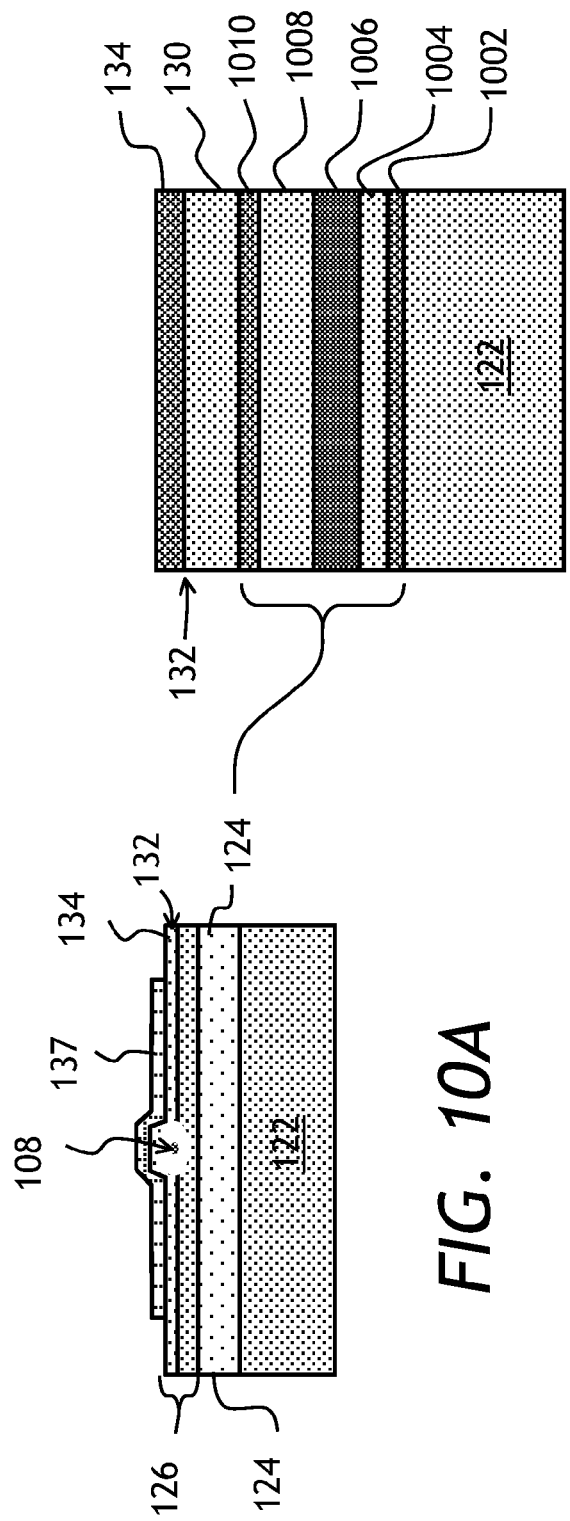

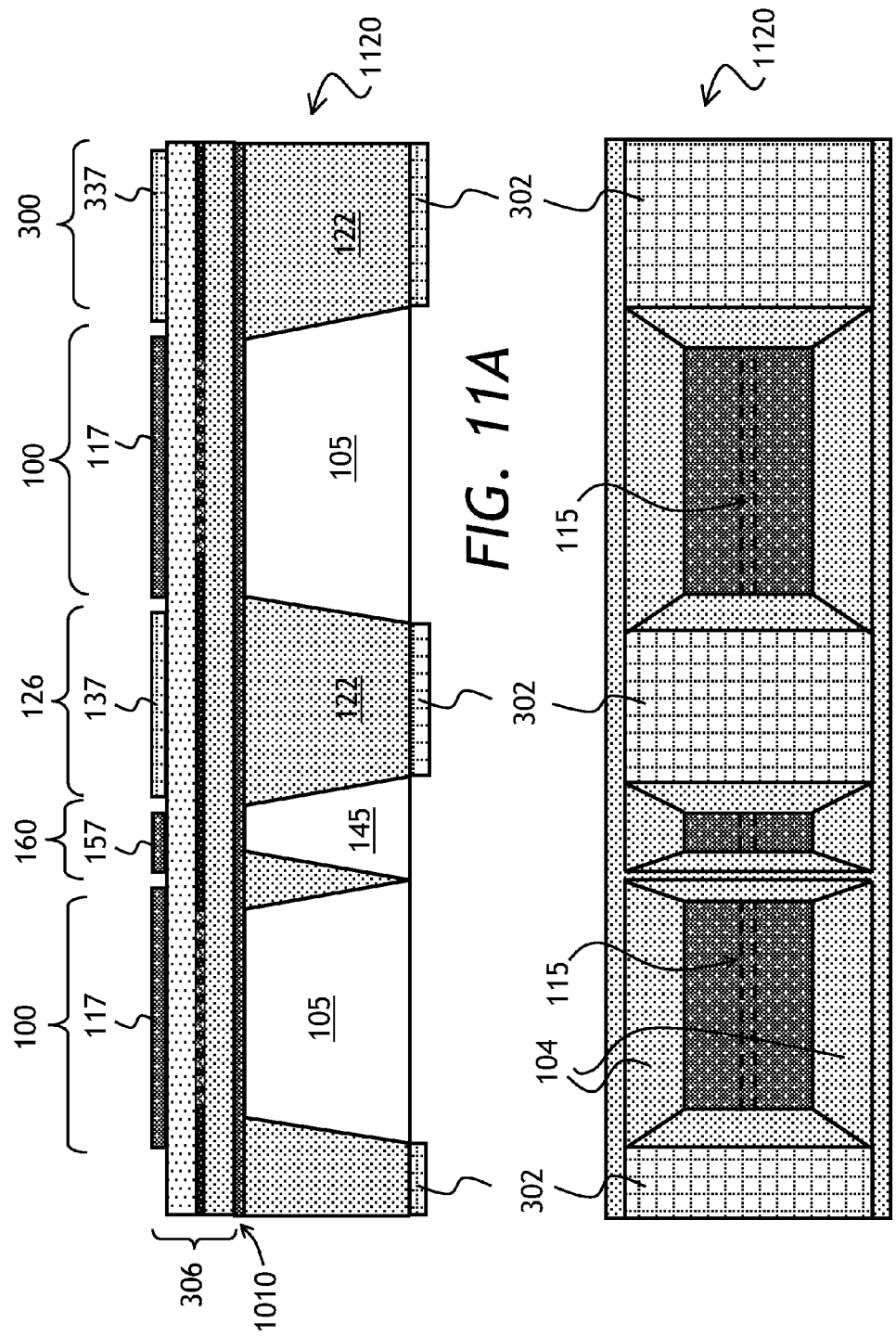

TUNABLE BRAGG GRATING AND A TUNABLE LASER DIODE USING SAME

TECHNICAL FIELD

The present invention relates to optical waveguides and lasers, and in particular to structures and methods for tuning optical waveguide gratings in lasers.

BACKGROUND OF THE INVENTION

A laser diode includes a p-n junction between a pair of mirrors for creating optical feedback for light generated and amplified at the p-n junction when a forward current is applied to the p-n junction. To provide wavelength tenability, the mirrors are made wavelength selective, and a reflection wavelength of at least one of the mirrors is tuned.

In waveguide laser diodes, waveguide gratings are frequently used as wavelength selective mirrors. In a waveguide grating, periodic perturbations of the effective refractive index of the waveguide are created to selectively reflect light at a wavelength corresponding to the spatial frequency of the periodic refractive index perturbations. A waveguide grating can be tuned by heating or, for waveguide gratings formed at a p-n junction, by providing a direct current to the p-n junction, which changes its overall refractive index through carrier injection.

Current-tunable p-n junction waveguide gratings have drawbacks. Supplying direct current to a waveguide grating can induce optical loss, which negatively impacts laser light generation efficiency and broadens the emission spectral linewidth of the laser. Thermally tuned gratings are generally free from these drawbacks. However, thermal tuning requires considerable amounts of heat applied to the waveguide grating to change its temperature, which can also impact the temperature of the lasing p-n junction. This is because waveguide gratings are typically fabricated integrated with the lasing p-n junction, which must be heat sunk very well to prevent overheating of the laser diode during normal operation. By way of example, Ishii et al. in an article entitled "Narrow spectral linewidth under wavelength tuning in thermally tunable super-structure grating (SSG) DBR lasers", published in IEEE Journal of Selected Topics in Quantum Electronics, Vol. 1, No. 2 (1995), pp. 401-407, disclose a super-structure grating distributed Bragg reflector laser, which can be thermally tuned over 40 nm by thermally tuning SSG reflectors. In the Ishii device, the max thermal tuning power dissipation per unit length of mirror to achieve full tenability was 1.3 mW per 1 micrometer of length, which for the front and back mirror section lengths used of 400 and 600 micrometers, respectively, corresponds to a prohibitively-high total power dissipation of 1300 mW. The tuning 1/e time constant is about 1.6 milliseconds, which is relatively slow.

Attempts have been made in the prior art to utilize thermal tuning more efficiently by thermally decoupling the waveguide grating from the common substrate with the lasing p-n junction. By way of example, Cunningham et al. in U.S. Pat. No. 7,848,599 disclose a thermally tunable waveguide that is free standing above a substrate to increase thermal resistance between the waveguide and the environment. Matsui et al. in U.S. Pat. No. 7,778,295 disclose a Distributed Bragg Reflector (DBR) laser, in which the DBR section of the laser is suspended over the substrate to increase the thermal resistance between the DBR section and the substrate.

Detrimentally, waveguides suspended over a substrate without additional structural support are prone to a mechanical failure. Multiple legs were used in a Cunningham device to support the suspended waveguide along their length, but these can result in an overly complex waveguide structure and/or interfere with the optical function of the waveguide.

It is therefore a goal of the invention to provide a tunable waveguide grating that could be tuned quickly and efficiently, substantially without degradation of spectral properties, while providing an adequate structural support for the waveguide.

SUMMARY OF THE INVENTION

In accordance with the invention, a waveguide Bragg grating is suspended over a substrate by plurality of fingers extending laterally away from the waveguide centerline, resulting in a simple and easily manufacturable structure. The Bragg grating can be in the form of a sampled grating, which consists of periodically spaced uniform grating bursts separated by blanked regions without gratings, and is characterized by a grating period of a high spatial frequency and a burst period of a low spatial frequency. More generally, the Bragg grating can consist of a slow spatial modulation of the grating strength or the grating phase along the waveguide centerline or optical axis, forming crests and valleys of modulation. The crests and valleys can be of a square shape, such as in a sampled grating, or of a smooth, wave-like varying shape.

According to the invention, the positions of the fingers are coordinated with the positions of the crests and valleys of modulation, to avoid disturbing the Bragg grating upon thermal tuning of the grating. When the Bragg grating is heated, the heat flows through the fingers, creating a quasi-periodic refractive index variation along the Bragg grating optical axis due to a quasi-periodic temperature variation created by the heat flow from the grating through the supporting fingers. Since the positions of the supporting fingers are coordinated with the positions of the grating modulation crests and valleys, the optical phase coherence is maintained between the grating modulation crests, so that the Bragg grating is not disturbed by the heating. As a result, smooth and continuous tuning of the Bragg grating is possible substantially without perturbing the reflection bandshape.

In accordance with the invention, there is provided a tunable Bragg grating comprising:

a first substrate section;

first and second spaced apart support bars extending upwardly from the first substrate section;

a first waveguide for guiding light therein, wherein the first waveguide has an optical axis and is supported by the first and second support bars above the first substrate section, so that a first gap exists between the first substrate section and the first waveguide, wherein an effective refractive index of the first waveguide is spatially modulated along the optical axis, forming a grating for reflecting an optical frequency component of the light guided by the first waveguide to propagate back therein, wherein at least one of phase or amplitude of the spatial modulation of the effective refractive index is varying along the optical axis, forming modulation crests and valleys, wherein the crests are spaced apart at a first spatial frequency along the optical axis; and a first resistive heater disposed on the first waveguide, for heating the first waveguide for tuning an optical frequency of the reflected optical frequency component;

wherein the first waveguide has first and second arrays of openings extending therethrough and into the first gap, the openings of the first and second arrays running along the optical axis of the first waveguide on respective opposite first and second sides of the optical axis, the first and second arrays of openings defining first and second arrays of heat conducting fingers, respectively, extending between the optical axis and the first and second support bars, respectively, wherein positions of the heat conducting fingers along the optical axis are coordinated with positions of the modulation crests and valleys along the optical axis, whereby, when heat is applied by the first resistive heater to the first waveguide, spatial refractive index variations, caused by spatial temperature variations along the optical axis due to heat flow through the heat conducting fingers to the first and second support bars, are spatially coordinated with the modulation crests and valleys.

In one embodiment, the spatial frequency of the heat conducting fingers along the optical axis is an integer multiple of the first spatial frequency.

In accordance with another aspect of the invention, there is further provided a tunable laser diode comprising:

the tunable Bragg grating as described above, a substrate comprising the first substrate section;

a spacer layer supported by the substrate, the spacer layer comprising the first and second support bars;

an active waveguide for amplifying the light, optically coupled to the tunable Bragg grating and disposed in mechanical, thermal, and electrical contact with the spacer layer; and an electrode disposed on the active waveguide, for providing electrical current thereto.

Preferably, the active waveguide and the first waveguide comprise a single monolithically fabricated shallow-ridge waveguide, which results in a particularly simple and efficient structure. Bulk micromachining from the back of the substrate can be used to have the first gap to extend completely through the first substrate section.

In accordance with yet another aspect of the invention, there is further provided a method for tuning a laser diode having an active waveguide, the method comprising:

(a) providing a tunable Bragg grating having a substrate, first and second spaced apart support bars extending upwardly from the substrate, and a first waveguide optically coupled to the active waveguide, wherein the first waveguide has an optical axis and is supported by the first and second support bars above the substrate, forming a gap between the substrate and the first waveguide, wherein an effective refractive index of the first waveguide is spatially modulated along the optical axis, forming a grating for reflecting an optical frequency component of the light guided by the first waveguide to propagate back therein, wherein at least one of phase or amplitude of the spatial modulation of the effective refractive index is varying along the optical axis, forming modulation crests and valleys spaced apart at a first spatial frequency along the optical axis;

(b) providing first and second arrays of openings extending through the first waveguide and into the gap, the openings of the first and second arrays of openings running on respective opposite first and second sides of the optical axis, the first and second arrays of openings defining first and second arrays of heat conducting fingers, respectively, extending from the optical axis towards the first and second support bars, respectively;

wherein step (b) comprises disposing the openings so that positions of the heat conducting fingers along the optical axis are coordinated with positions of the modulation crests and valleys along the optical axis; and (c) heating the first waveguide for tuning the optical frequency of the optical frequency component, thereby tuning the laser diode.

BRIEF DESCRIPTION OF THE DRAWINGS

Exemplary embodiments will now be described in conjunction with the drawings, in which:

FIG. 1B is a magnified view of the DBR of FIG. 1A superposed with a corresponding effective refractive index plot of the Bragg grating, showing burst modulation of the grating;

FIG. 1C is a plan view of a variant of the Bragg grating having a continuous variation of modulation depth, superposed with a corresponding refractive index plot;

FIGS. 2A, 2B, and 2C are cross-sectional views taken along lines A-A, B-B, and C-C, respectively, of FIG. 1A;

FIG. 10A is a cross-sectional view of the SG-DBR laser of FIG. 1A;

FIG. 10B is a magnified cross-sectional view of FIG. 10A; and

FIGS. 11A and 11B are side and bottom views, respectively, of a SG-DBR laser, in which the tunable Bragg gratings are suspended over the substrate by using bulk micromachining.

DETAILED DESCRIPTION OF THE INVENTION

Figure 1A:
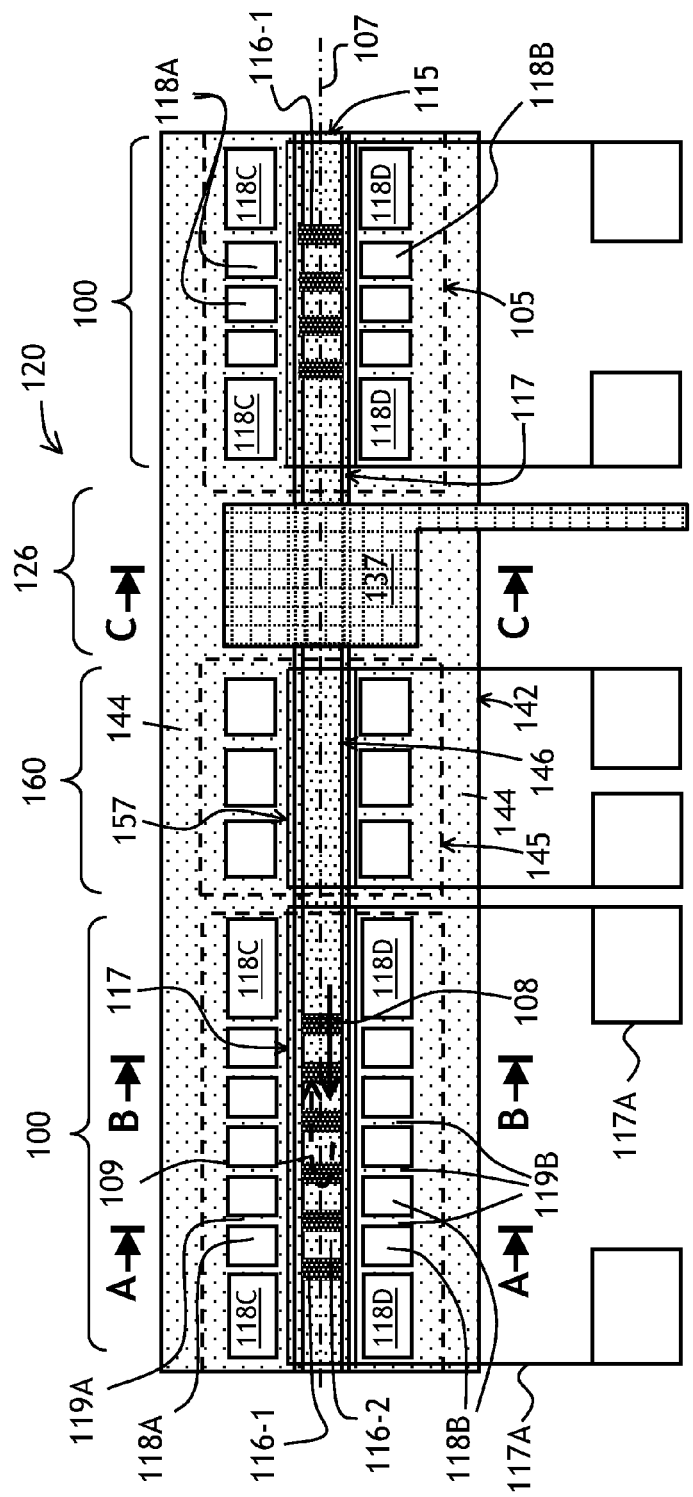
FIG. 1A is a top schematic view of a Sampled Grating Distributed Bragg Reflector (SG-DBR) laser of the invention including a tunable Bragg grating of the invention.

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Referring to FIG. 1A and FIGS. 2A to 2C, a SG-DBR laser 120 of the invention includes front and back tunable Bragg gratings (DBR) 100, a gain section 126, and an optional phase section 160. In the embodiment shown, the Bragg gratings 100, the gain section 126, and the phase section 160 are sections of a ridge waveguide structure having a common top ridge 115 for guiding a light mode 108.

The Bragg gratings 100 include a first substrate section 102, first and second spaced apart support bars 104 extending upwardly from the first substrate section 102, a first ridge waveguide 106, and a first resistive heater 117. The first ridge waveguide 106 is supported by the first and second support bars 104 above the first substrate section 102, forming a first gap 105 between the first substrate section 102 and the first ridge waveguide 106. The first ridge waveguide 106 includes a stack of: a bottom cladding layer 110 supported by the first and second support bars 104, a core layer 112 disposed on the bottom cladding layer 110, and a top cladding layer 114 disposed on the core layer 112. The top cladding layer 114 has the ridge 115 on top, for guiding the light mode 108 along the ridge 115.

The refractive index of the core layer 112 is higher than refractive indices of the top 114 and bottom 110 cladding layers, for confining the light 108 guided by the ridge 115 substantially to the core layer 112. The effective refractive index of the first ridge waveguide 106 is spatially modulated, forming a grating for reflecting an optical frequency component 109 of the light 108 guided by the first ridge waveguide 106 to propagate back therein. For example, the refractive index of the core layer 112 can be spatially modulated, or the ridge 115 can be laterally corrugated to create the spatial modulation of the effective refractive index. At least one of phase or amplitude of the spatial modulation of the effective refractive index is varying along the optical axis, forming modulation crests 116-1 and valleys 116-2. By way of example, the grating period can be about 0.24 micrometers, the length of a sampled grating burst (modulation crest 116-1) can be 3 micrometers, the burst period, or distance between neighboring crests 116-1 can be 50 micrometers. By way of example, there can be 7 to 11 crests 116-1 per DBR 100. The first resistive heater 117 is disposed on an insulating dielectric layer, not shown, which is deposited on the top cladding layer 114.

The first ridge waveguide 106 has first and second arrays of openings 118A and 118B, respectively, extending through the first ridge waveguide 106 and into the first gap 105. As seen in FIG. 1A, the openings 118A and 118B run on opposite sides of the ridge 115, defining first and second arrays of heat conducting fingers 119A and 119B, respectively, extending from the ridge 115 towards the first and second support bars 104. Preferably, first and last openings 118C of the first array of the openings 118A are longer than the remainder of the openings 118A. Similarly, the first and last openings 118D of the first array of the openings 118B are preferably longer than the remainder of the openings 118B. The longer openings 118C and 118D facilitate creation of a more uniform temperature distribution upon heating the DBR 100 by the first resistive heater 117. Both length and width of first and last openings 118C and 118D can be adjusted to improve the temperature uniformity.

Referring now to FIGS. 1B and 1C, the first ridge waveguide 106 can be burst-modulated (FIG. 1B) or smoothly modulated (FIG. 1C), or modulated in a more complicated manner. The modulation can include amplitude or phase modulation or both. The modulation can be periodic or quasi-periodic. In FIG. 1B, the modulation crests 116-1 comprise bursts of a sampled Bragg grating, having substantially no modulation in the valleys 116-2 between the bursts 116-1. In FIG. 1C, the modulation is more smooth, so that the modulation valleys 116-2 have some refractive index modulation. The modulation crests 116-1 are spaced apart at a first spatial frequency $f_1$ along an optical axis 107 of the first ridge waveguide 106. As shown in FIGS. 1B and 1C with dashed lines 150, positions of the heat conducting fingers 119A along the optical axis 107 are coordinated with positions of the modulation crests 116-1 and valleys 116-2 along the optical axis 107. As a result, when heat is applied by the first resistive heater 117 to the first ridge waveguide 106, spatial refractive index variations, caused by spatial temperature variations along the optical axis 107 due to heat flow through the heat conducting fingers 119A and 119B to the first and second support bars 104, are spatially coordinated with the modulation crests 116-1 and valleys 116-2. The fingers 119B are omitted in FIGS. 1B and 1C for clarity, although they are also coordinated with the modulation crests 116-1 and valleys 116-2.

In a preferred embodiment, the second spatial frequency $f_2$ of the heat conducting fingers 119A and 119B along the ridge 115 is an integer multiple of the first spatial frequency $f_1$. For instance, in FIG. 1B, $f_2=2f_1$; and in FIG. 1C, the frequencies $f_1$ and $f_2$ are equal.

Referring back to FIGS. 1A and 2C, the gain section 126 includes a substrate 122, which is preferably a common substrate with the first substrate section 102, a spacer layer 124 supported by the substrate 122, an active waveguide 126 for amplifying the light mode 108, and a first electrode 137 for providing electrical current to the active waveguide 126. As best seen by comparing FIGS. 2A, 2B, and 2C, the spacer layer 124 includes the first and second support bars 104 of the tunable DBR section, or Bragg grating 100. The active waveguide 126 is optically coupled to the tunable DBR section 100 and disposed in mechanical, thermal, and electrical contact with the spacer layer 124. The active waveguide layer 126 includes the stack of: a first conductivity type layer 130 supported by the spacer layer 124 and integrally formed with the bottom cladding layer 110; a junction layer 132 supported by the first conductivity type layer 130 and integrally formed with the core layer 112; and a second conductivity type layer 134 supported by the junction layer 132 and integrally formed with the top cladding layer. The ridge 115 runs through the first ridge waveguide 106 and the active waveguide 126 for providing optical coupling therebetween. In one embodiment, the first and second conductivity type layers 130 and 134, respectively, include n- and p-doped InP layers, respectively, the junction layer 132 includes InGaAsP quantum wells, and the spacer layer 124 includes an InGaAs layer.

Still referring to FIG. 1A, the phase section 160 is a variant of the structure of the DBR section 100, lacking the spatial modulation of the refractive index. The phase section 160 includes a second substrate section 142, third and fourth support bars 144 extending upwardly from the second substrate section 142, and a second ridge waveguide 146 for guiding the light mode 108, supported by the third and fourth support bars 144 above the second substrate section 142, forming a second gap 145 between the second substrate section 142 and the second ridge waveguide 146. The second ridge waveguide 146 includes the same stack as the first ridge waveguide 106, with the difference that the effective refractive index of the second ridge waveguide 146 is not spatially modulated. A second resistive heater 157 is disposed on the top cladding layer 114, for providing heating of the second ridge waveguide 146 for tuning optical phase of the light mode 108 propagating therein.

In operation, the guided light mode 108 generated in the gain section 126 propagates along the ridge 115. An optical frequency component 109 of the guided light mode 108 is reflected to propagate back along the ridge 115 towards the gain section 126, thus providing an optical feedback to the laser 120. The reflected optical frequency component 109 has a wavelength corresponding to the spatial frequency of the effective refractive index modulation of the first ridge waveguide 106. The first resistive heater 117 provides heating to the first ridge waveguide 106, for tuning the optical frequency of the reflected optical frequency component 109. When heat is applied by the first resistive heater 117 to the first ridge waveguide 106, spatial refractive index variations, caused by spatial temperature variations along the ridge 115 due to heat flow through the heat conducting fingers 119A and 119B to the first and second support bars 104, are spatially coordinated with the modulation crests 116-1. As a result, the heating by the first resistive heater 117 substantially does not disturb or modify the reflected frequency spectrum beyond simply tuning of the center frequency of the reflected frequency spectrum. This allows one to reduce a bandwidth variation as the laser 120 is tuned in optical frequency or wavelength.

The first and second gaps 105 and 145 can be filled with a chemically inert gas such as xenon, argon, or nitrogen. Also, the first and second gaps 105 and 145 can form a single gap, although the latter structure will have somewhat increased thermal crosstalk between the tunable DBR and phase sections 100 and 160, respectively; this is why two separate gaps 105 and 145 are preferred. The gap 105 can be formed by lateral selective undercut etching of the sacrificial spacer layer 124. The gap 145 can be formed by selective etching of the spacer layer through the openings 118A, 118B, 118C, and 118D. These etching techniques are generally referred to as "micromachining", a term adopted from micro-electro-mechanical systems (MEMS) manufacturing.

The first and second ridge waveguides 106 and 146, respectively, and the active waveguide 126 preferably form a single monolithic shallow-ridge waveguide structure having the active section 126, the tunable Bragg grating or DBR section 100, and the phase section 160. The openings 118A-118D and the gap 105 are particularly easy to form in shallow-ridge waveguides, ensuring ease of overall manufacture. However, it is to be understood that the ridge type waveguides are only example embodiments of waveguides of the invention. Other waveguide types, known to a person skilled in the art, can also be used in the tunable Bragg grating 100, the gain section 126, and/or the phase section 160. Similarly to the ridge type waveguide 106, the other waveguide types must be suspended over the substrate 102 by the support bars 104, and the at least one of phase or amplitude of the spatial modulation of the effective refractive index of the Bragg grating 100 has to have a plurality of crests 116-1 and valleys 116-2. The positions of the heat conducting fingers 119A and 119B along the optical axis 107 have to be coordinated with the positions of the crests 116-1 and valleys 116-2 along the optical axis 107, to lessen the bandshape variation of the reflected optical frequency component 109.

Figure 3A:
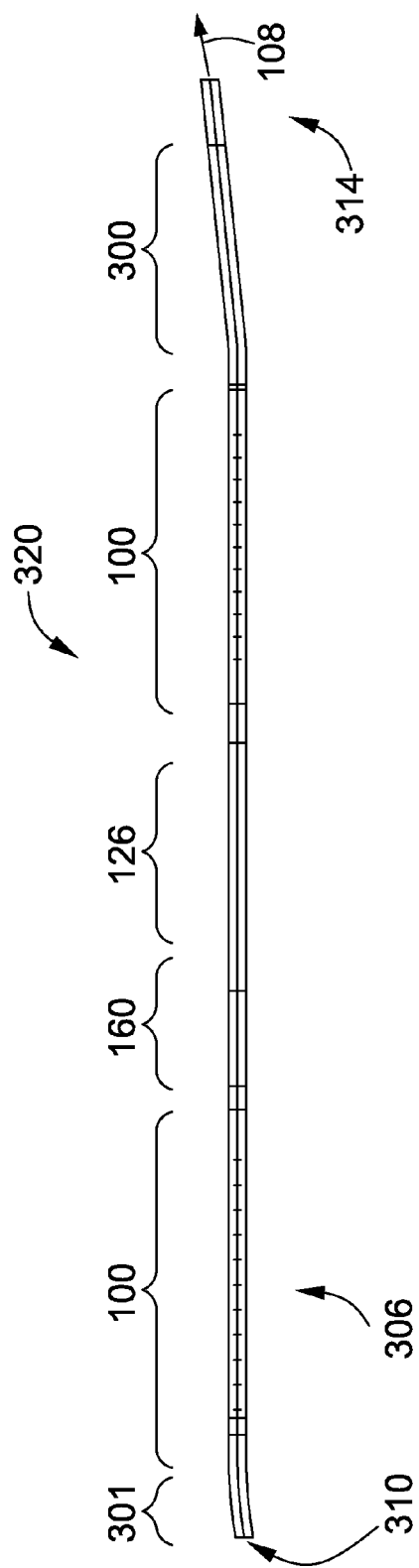
FIGS. 3A and 3B are a plan and side cross-sectional views, respectively, of an embodiment of the SG-DBR laser of FIG. 1A, comprising an optical amplifier section.
Figure 3B:
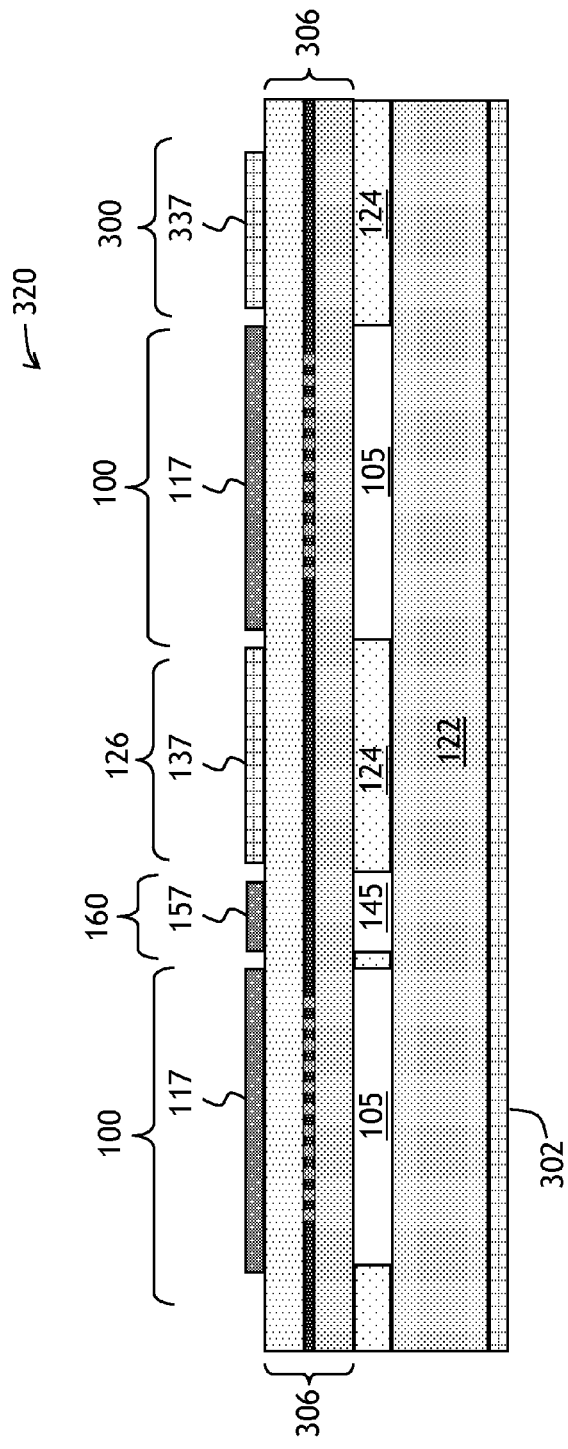

Turning now to FIGS. 3A and 3B with further reference to FIGS. 1A and 2A to 2C, an embodiment 320 of the SG-DBR laser 120 of FIG. 1A includes two tunable DBR sections 100, the phase section 160, the gain section 126, and an amplifier section 300 formed within a common shallow-ridge waveguide 306 suspended over the common substrate 122 at the tunable DBR sections 100 and the phase section 160. A back-facet absorber section 301 is provided for absorbing laser light at the left-hand side of the waveguide 306 in FIG. 3A, to prevent light reflected from a left facet 310 of the shallow-ridge waveguide 306 to interfere with light selectively reflected by the left tunable Bragg grating 100. A common backplane electrode 302 is electrically coupled to a back side of the substrate 122. The gain section 126 is powered with the first electrode 137, and the amplifier section 300 is powered by a second electrode 337 or providing electrical current to the amplifier section 300. The first and second electrodes 137 and 337, and the heaters 117 and 157 are omitted in FIG. 3A, so as not to hide the underlying structures. The function of the amplifier section 300 is to amplify the light 108 generated in the gain section 126, to provide a constant output power as the emission wavelength of the laser 320 is tuned by the synchronously tuned Bragg gratings 100. The output power can be measured by an integrated photodetector 314.

Figure 4:
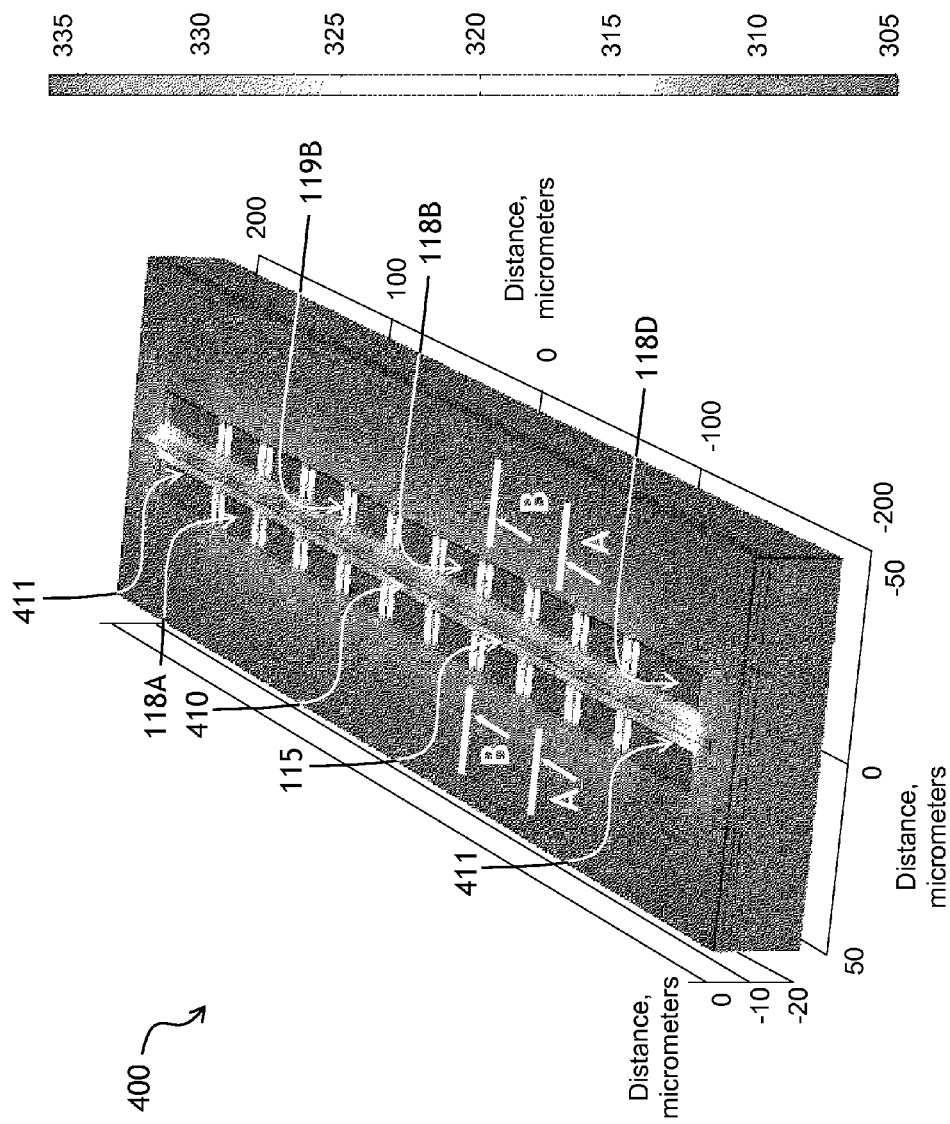
FIG. 4 is a three-dimensional view of an embodiment of a tunable Bragg grating having a uniform top heater, showing a simulated temperature distribution of the surface of the Bragg grating.
Figures 5A, 5B:
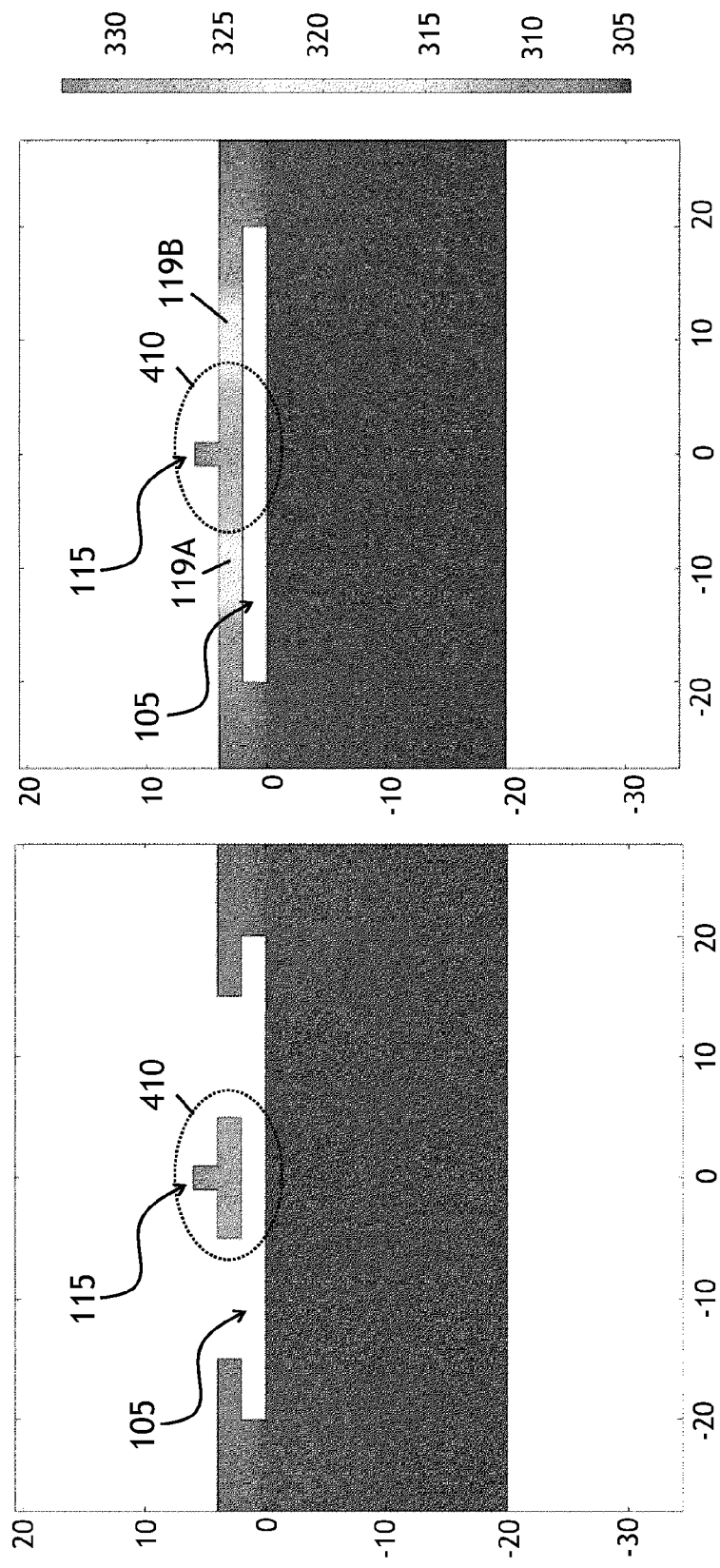
FIGS. 5A and 5B are cross-sectional views of the temperature distribution of the tunable Bragg grating of FIG. 4 taken along lines A-A and B-B, respectively, of FIG. 4.

In a preferred embodiment, the resistive heaters 117 of the tunable Bragg gratings 100 are uniform thin-film resistive heaters applied to the ridge 115 of the ridge waveguide 106, with current passing along the length of the heater 117 between two contact pads 117A. A passivating layer of dielectric is disposed between the thin-film heater 117 and the underlying ridge waveguide 106. Referring to FIGS. 4, 5A, and 5B, with further reference to FIGS. 1A, 2A to 2C, 3A, and 3B, a numerical simulation has been performed for an embodiment 400 of the tunable Bragg grating 100 having the uniform heater 117 (not shown in FIG. 4) running along the ridge 115. Positions, lengths, and widths of the openings 118A to 118D are selected so as to create a substantially uniform temperature distribution along the ridge 115. The positions, lengths, and widths of the openings 118A to 118D define lengths and widths of the heat conducting fingers 119A and 119B. As seen in FIG. 4, the openings 118A and 118B define a mesa 410 therebetween, and this mesa 410 limits the optical interaction between the optical mode 108 of the ridge waveguide 106 and the refractive index discontinuity resulting from the openings 118A, 118B. The length and width of the mesa 410 including end mesa sections 411 have an impact on the resulting temperature distribution. In the simulation of FIGS. 4, 5A, and 5B, the ridge 115 is 2 micrometers tall and 2 micrometers wide. The mesa width (distance between the openings 118A and 118B of the first and second arrays, respectively) is 20 micrometers, the thickness of the mesa sections 410, 411 is 2 micrometers, and the height of the gap 105 (vertical dimension of the gap 105 in FIGS. 2A and 2B) is 2 micrometers. The total length of the mesa 410 is 400 micrometers. The material is InP. When 25 mW of uniform heat flux is applied to the mesa 410, a temperature distribution is formed. In FIG. 5A, the simulated temperature distribution of the mesa 410 between the heat conducting fingers 119A and 119B is shown. In FIG. 5B, the temperature distribution is along the heat conducting fingers 119A and 119B.

Figure 6:
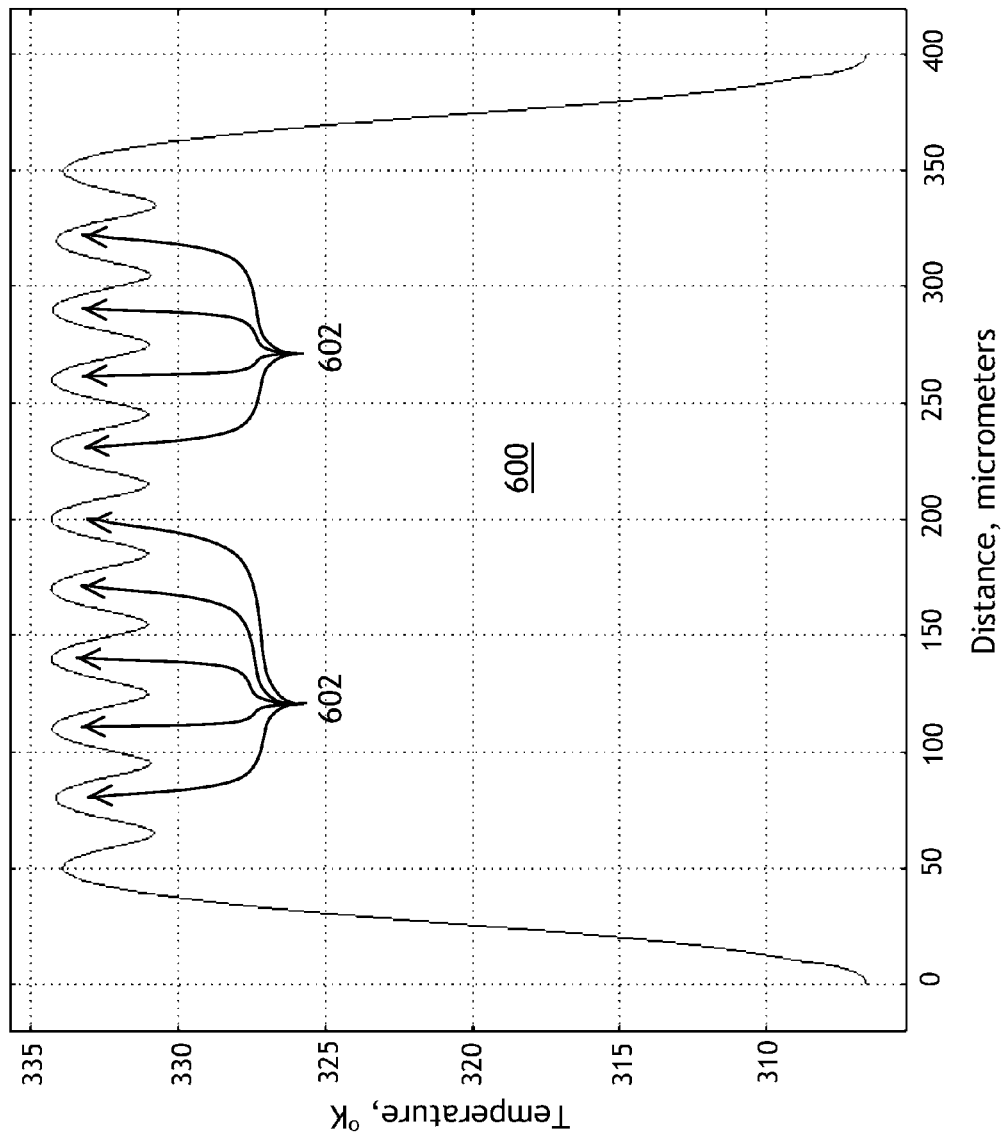
FIG. 6 is a longitudinal distribution of the waveguide temperature of the tunable Bragg grating of FIG. 4.

Turning to FIG. 6 with further reference to FIGS. 1A, 4, 5A, and 5B, a longitudinal distribution 600 of the temperature of the waveguide sections 410, 411 is shown. The temperature varies from approximately 303° K to 334° K. One can see from FIG. 6 that the temperature along the mesa sections 410, 411 oscillates at approximately 3° K peak-to-peak amplitude, the peaks of the temperature distribution being denoted at 602. The peak temperatures have been made substantially uniform by optimizing the geometry of the end openings 118C and 118D and the end mesa sections 411, such that heat generation along the end mesa section 411 is balanced by heat conduction through the end mesa section 411 to the spacer layer 124 and the substrate 122. Since the positions of the heat conducting fingers 119A and 119B along the ridge 115 are coordinated with the positions of the modulation crests 116-1 along the ridge 115, the temperature oscillation peaks 602 are also coordinated with the positions of the modulation crests 116-1 (not shown in FIGS. 4, 5A, 5B), thus maintaining optical phase coherence of the optical signal 108 between the modulation crests 116-1. When the phase coherence is maintained and the temperature peaks 602 are substantially uniform, the spectral filtering properties of the Bragg grating 100 are very similar to those with an ideally even temperature profile. It is to be understood that the end mesa sections 411, where the temperature is varying from approximately the temperature of the substrate 102 at the ends to the peak temperature at the first fingers 119A and 119B, can minimally include gratings because of the highly non-uniform temperature profile.

Figure 7:
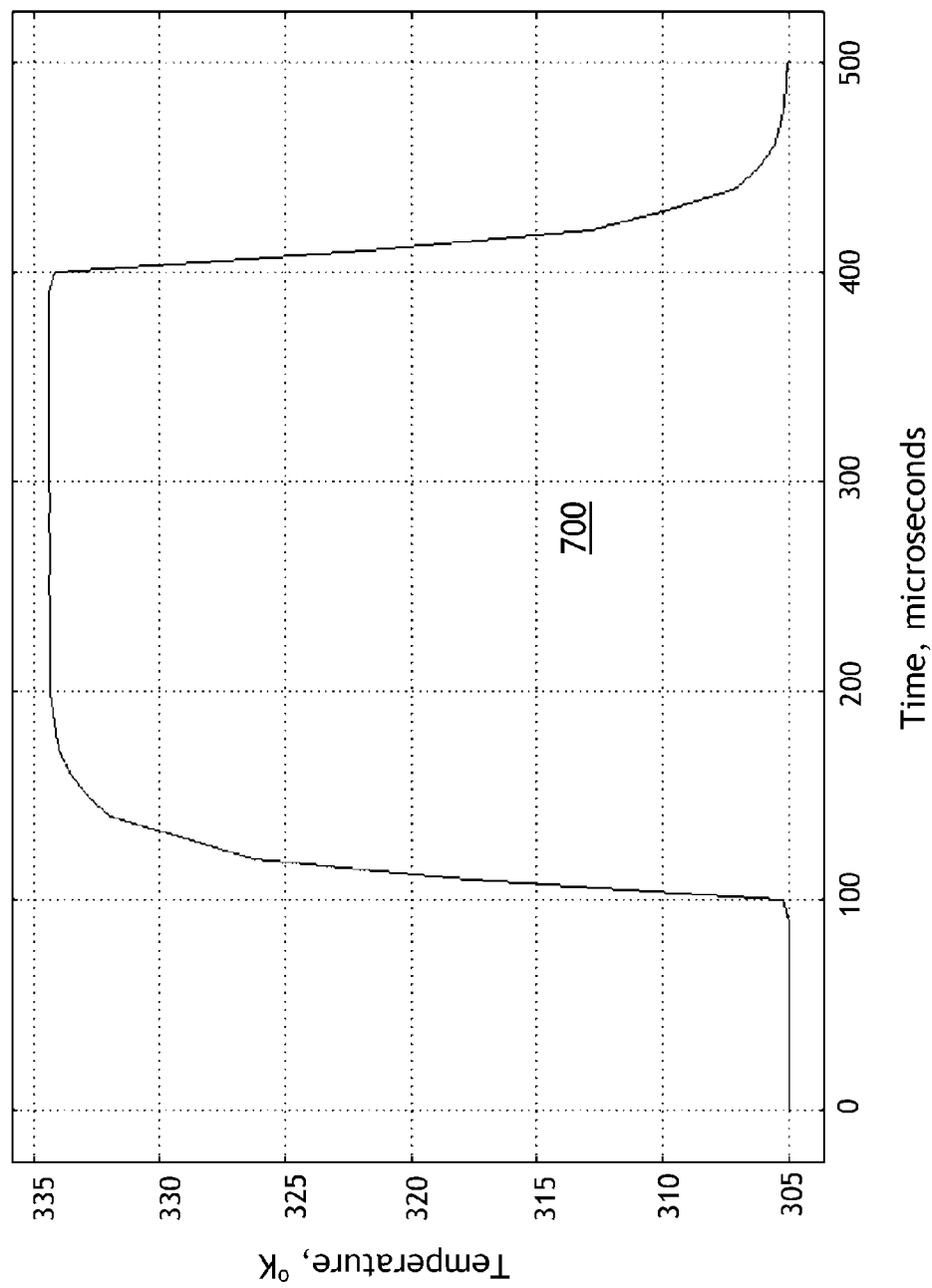
FIG. 7 is a simulated temporal plot of the temperature variation upon application of a heat pulse to the Bragg grating of FIG. 4.

Referring now to FIG. 7, a simulated time trace 700 of temperature rise upon a quasi-instantaneous application of the 25 mW of heater power shows that the 27.5° K temperature increase is achieved in less than 100 microseconds. The cooling-down time is also below 100 microseconds, which is more than 16 times faster than the tuning time reported by Ishii et al. in the above-mentioned paper entitled "Narrow spectral linewidth under wavelength tuning in thermally tunable super-structure grating (SSG) DBR lasers", published in IEEE Journal of Selected Topics in Quantum Electronics, Vol. 1, No. 2 (1995), pp. 401-407. Only 25 mW of heater power is required to create 27.5° K temperature increase, corresponding to approximately 2.7 nm of tuning the wavelength of the reflected component 109. Full tenability of >~5 nm, needed for typical peak spacings in sampled or modulated grating DBRs, requires only 50 mW heater power, which is approximately a 10-fold reduction compared to that reported by Ishii. This illustrates the capability of the tunable Bragg grating 100 to quickly and efficiently tune the wavelength of the SG-DBR laser 120.

Figure 8:
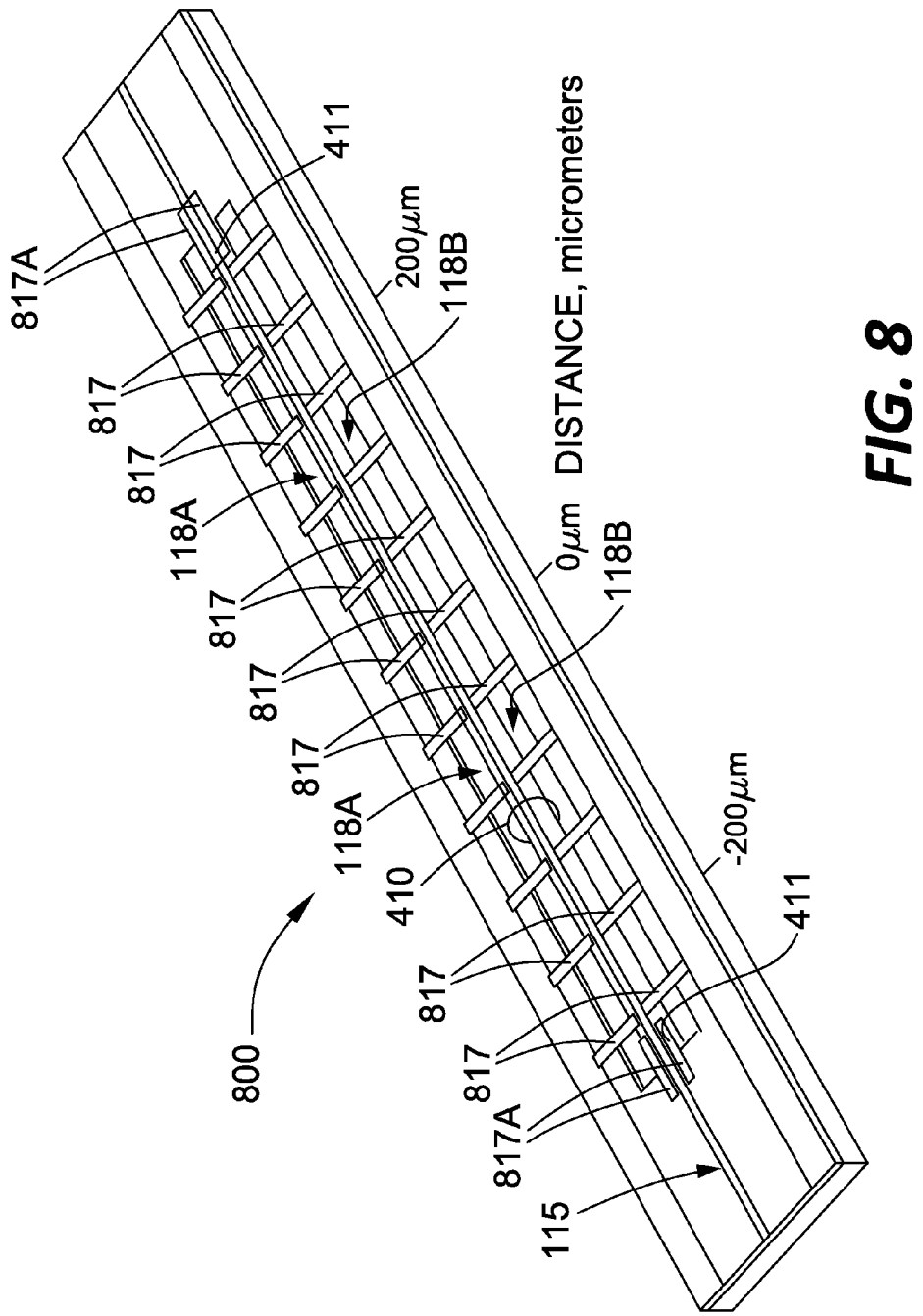
FIG. 8 is a three-dimensional view of an embodiment of a tunable Bragg grating having a plurality of electrically connected, jointly driven individual heaters.
Figure 9A:
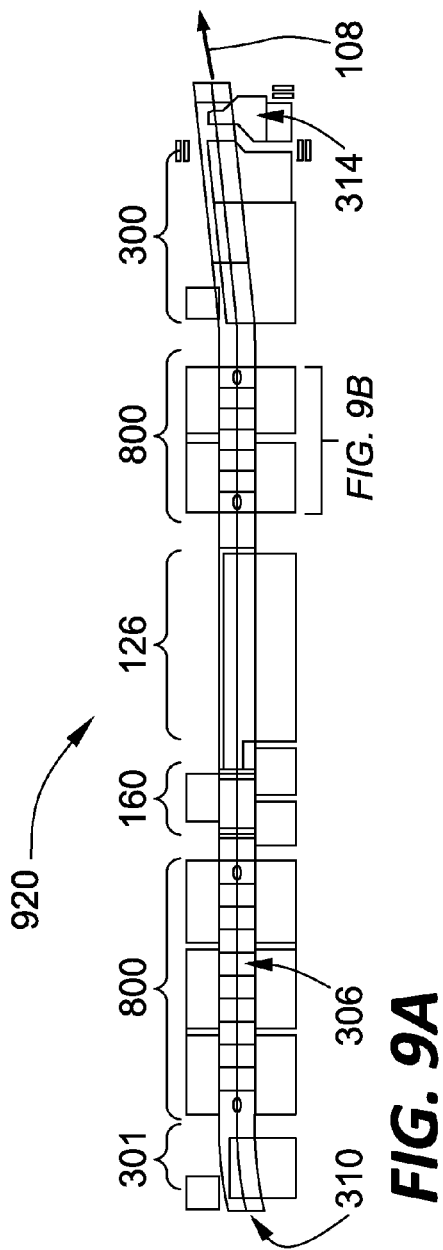
FIG. 9A is a SG-DBR laser including the tunable Bragg grating of FIG. 8.
Figure 9B:
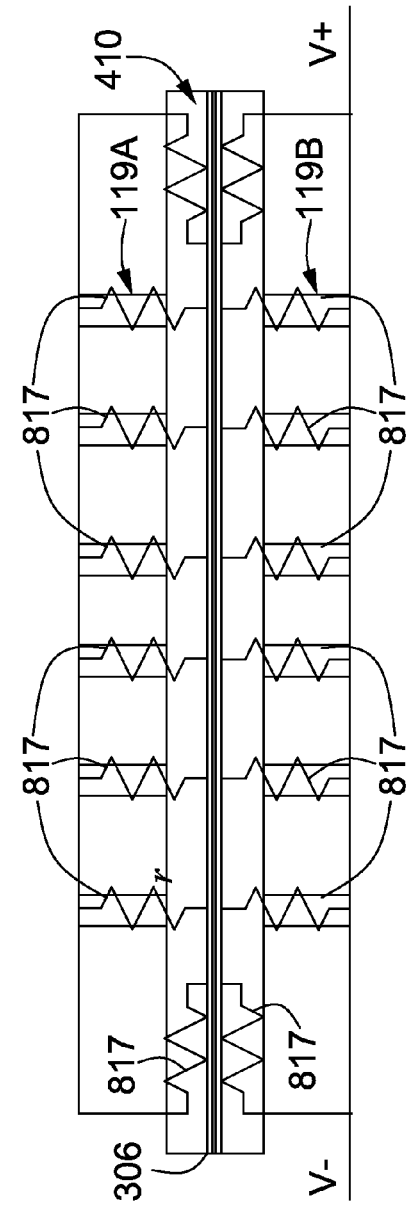
FIG. 9B is a schematic top view of the connection of the resistive heaters of the tunable Bragg grating of FIG. 8.

Referring to FIG. 8 with further reference to FIG. 1A, a tunable Bragg grating 800 is a variant of the tunable Bragg grating 100 of FIG. 1A. In the tunable Bragg grating 800 of FIG. 8, the first resistive heater 117 includes a plurality of electrically coupled individual thin-film heaters 817 running on top of the heat conducting fingers 119A and 119B. Additional heater elements 817A are disposed on the ends 411 of the mesa 410, to further improve uniformity of the temperature distribution. Turning to FIG. 9A, a SG-DBR laser 820 is a variant of the SG-DBR laser 320 of FIG. 3A. In the SG-DBR laser 920 of FIG. 9, the tunable Bragg gratings 100 of FIGS. 1A, 2A, and 2B have been replaced with the tunable Bragg gratings 800 of FIG. 8. Referring now to FIG. 9B, the individual thin-film heaters 817, having the electrical resistance r, are connected in four serial groups of four parallel heaters 817, resulting in a total resistance between V− and V+ electrodes R=4r/4=r. A comparable longitudinal heater, for example a tantalum nitride (TaN) thin film of a same thickness, would have many times higher resistance. This connection of the individual heaters 817 can better match the impedance of driving electronics, not shown. Of course, other connections are possible, to tailor the total resistance R to a requirement of the driving electronics. To provide an adequate heating, the individual thin-film heaters 117 must run on top of at least some of the heat conducting fingers 119A and 119B. By placing heating elements 117 only on the heat conducting fingers 119A and 119B and on the ends 411 of the mesa 410, a substantial reduction in the longitudinal peak-to-peak temperature variation along the mesa 410 can be achieved.

Turning to FIG. 10A with further reference to FIGS. 1A and 2A to 2C, the spacer layer 124 can include a sacrificial InGaAs layer. 1-2 micrometer thick sacrificial InGaAs layer 124 provides a good electrical contact of the active waveguide 126 to the substrate 122. Detrimentally, such a thick sacrificial InGaAs layer 124 can be difficult to grow and subsequently micromachine to manufacture the support bars 104, and its thermal impedance will have a deleterious effect on active section performance. Reducing thickness of the sacrificial InGaAs layer 124 will result in a reduced height of the support bars 104, leading to heat conduction across the gap 105, which is detrimental to the thermal tuning efficiency. To overcome this tradeoff, the spacer layer 124 can be made in form of a stack including several different layers. Referring to FIG. 10B, the spacer layer 124 includes in sequence from bottom to top a 20 nm thick InGaAsP bottom etch stop layer 1002 having a bandgap wavelength of 1.2 µm, a 200 nm thick InP bottom second stage sacrificial layer 1004, a 200 nm thick first stage InGaAs sacrificial layer 1006, a 2000 nm thick InP top second stage sacrificial layer 1008, and a 20 nm thick InGaAsP top etch stop layer 1010. InP can be grown much more easily to a larger thickness than InGaAs. As a result, the thickness of the multilayer stack spacer layer 124 can be increased, the thickness of at least one of the InP sacrificial layers 1004 and 1008 being larger than the thickness of the InGaAs sacrificial layer 1006, and the total thickness of the InGaAs or InGaAsP material can be reduced. The spacer layer 124 of FIG. 10B can then be etched, or micromachined, in two etching steps, one for the InGaAs layer 1006 to achieve lateral undercut, and one for the InP layers 1004 and 1008 to etch vertically to achieve the thicker gap 105.

Referring now to FIGS. 11A and 11B with a supplementary reference to FIGS. 3A and 3B, a SG-DBR laser 1120 is an embodiment of the SG-DBR laser 320 of FIG. 3. In the SG-DBR laser 1120 of FIGS. 11A and 11B, the first and second gaps 105 and 145 of the tunable Bragg grating sections 100 and the phase section 160, respectively, extend completely through the substrate 122. This can be achieved by using bulk micromachining techniques known from MEMS technologies, by etching through the bottom of the substrate 122.

It is to be understood that the invention as described above is not limited to particular types of waveguide structures and/or to particular material systems. In general, any laser diode having an active waveguide for laser light generation, for example the active waveguide 126 of FIG. 1A, can be tuned according to the invention by following the three steps A, B, and C.

Step A includes providing a tunable Bragg grating such as the tunable DBR 100, having the first substrate section 102, the first and second spaced apart support bars 104 extending upwardly from the substrate section 102, and a first waveguide, for example the ridge waveguide 106 optically coupled to the active waveguide 126. The first waveguide 106 is supported by the support bars 104 above the first substrate section 102, forming the gap 105 between the first substrate section 102 and the first waveguide 106. The effective refractive index of the first waveguide is spatially modulated along the optical axis 107, forming a grating for reflecting the optical frequency component 109 of the light 108 guided by the ridge waveguide 106 to propagate back. At least one of phase or amplitude of the spatial modulation of the effective refractive index is varying along the optical axis, forming the modulation crests 116-1 and valleys 116-2 (best seen in FIGS. 1B and 1C) spaced apart at a first spatial frequency $f_1$ along the optical axis 107.

Step B includes providing first and second arrays of the openings 118A to 118D extending through the first waveguide 106 and into the gap 105, the openings 118A to 118D running on respective opposite first and second sides of the optical axis 107 as shown. The openings (118A, 118C) and (118B, 118D) define first and second arrays of heat conducting fingers 119A and 119B, respectively, extending from the optical axis 107 towards the support bars 104. Step B includes disposing the openings 118A to 118D so that positions of the heat conducting fingers 119A and 119B along the optical axis 107 are coordinated with the positions of the modulation crests 116-1 along the optical axis 107. Step B can also include disposing the first and last, or end openings 118C and 118D to achieve a substantially uniform longitudinal temperature profile along the length of the first waveguide 106 containing the grating.

Step C includes heating the first waveguide 106 for tuning the optical frequency of the optical frequency component, thereby tuning the laser diode. Due to coordination of the position of the heat conducting fingers 119A and 119B with the modulation crests 116-1, the optical phase coherence of the light mode 108 is maintained between the modulation crests 116-1, so that the spectral bandshape of the light 109 reflected by the tunable Bragg grating 100 is not disturbed, or at least disturbed less, in the process of tuning.

In one embodiment, Step B comprises disposing the openings 118A to 118D so that the first and second arrays of the respective heat conducting fingers 119A and 119B are disposed at a second spatial frequency along the optical axis 107, wherein the second spatial frequency is an integer multiple of the first spatial frequency.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A tunable Bragg grating comprising:
a first substrate section;
first and second spaced apart support bars extending upwardly from the first substrate section;
a first waveguide for guiding light therein, wherein the first waveguide has an optical axis and is supported by the first and second support bars above the first substrate section, so that a first gap exists between the first substrate section and the first waveguide,
wherein an effective refractive index of the first waveguide is spatially modulated along the optical axis, forming a grating for reflecting an optical frequency component of the light guided by the first waveguide to propagate back therein, wherein at least one of phase or amplitude of the spatial modulation of the effective refractive index is varying along the optical axis, forming modulation crests and valleys, wherein the crests are spaced apart at a first spatial frequency along the optical axis; and
a first resistive heater disposed on the first waveguide, for heating the first waveguide for tuning an optical frequency of the reflected optical frequency component;
wherein the first waveguide has first and second arrays of openings extending therethrough and into the first gap, the openings of the first and second arrays running along the optical axis of the first waveguide on respective opposite first and second sides of the optical axis, the first and second arrays of openings defining first and second arrays of heat conducting fingers, respectively, extending between the optical axis and the first and second support bars, respectively,
wherein positions of the heat conducting fingers along the optical axis are coordinated with positions of the modulation crests and valleys along the optical axis,
whereby, when heat is applied by the first resistive heater to the first waveguide, spatial refractive index variations, caused by spatial temperature variations along the optical axis due to heat flow through the heat conducting fingers to the first and second support bars, are spatially coordinated with the modulation crests and valleys.

2. The tunable Bragg grating of claim 1, wherein the first and second arrays of heat conducting fingers are disposed at a second spatial frequency along the optical axis, wherein the second spatial frequency is an integer multiple of the first spatial frequency.

3. The tunable Bragg grating of claim 1, wherein the modulation crests comprise bursts of a sampled Bragg grating.

4. The tunable Bragg grating of claim 1, wherein the openings of the first and second arrays of openings each have a length along the optical axis, wherein the lengths of first and last openings of each of the first and second arrays of openings are larger than the length of any other opening of the first and second arrays of openings.

5. The tunable Bragg grating of claim 1, wherein the first gap extends completely through the first substrate section.

6. The tunable Bragg grating of claim 1, wherein the first waveguide comprises a ridge waveguide including a stack of:
a first bottom cladding layer supported by the first and second support bars;
a first core layer disposed on the first bottom cladding layer; and
a first top cladding layer disposed on the first core layer, the first top cladding layer having a ridge on top thereof running parallel to the optical axis, for guiding the light along the ridge;
wherein a refractive index of the first core layer is higher than refractive indices of the first top and bottom cladding layers, for confining the light guided by the ridge substantially to the first core layer;
wherein the first resistive heater is disposed on the first top cladding layer;
wherein the openings of the first and second arrays of openings run along the ridge, on respective opposite first and second sides thereof.

7. The tunable Bragg grating of claim 6, wherein the first resistive heater comprises a continuous thin-film heater running atop the ridge, wherein positions, lengths, and widths of the openings are selected so as to create a substantially uniform temperature distribution along a portion of the ridge including the modulation crests and valleys.

8. The tunable Bragg grating of claim 6, wherein the first resistive heater comprises a plurality of electrically coupled individual thin-film heaters running on top of at least some of the heat conducting fingers of the first and second arrays of the heat conducting fingers.

9. A tunable laser diode comprising:
the tunable Bragg grating of claim 1;
a substrate comprising the first substrate section;
a spacer layer supported by the substrate, the spacer layer comprising the first and second support bars;
an active waveguide for amplifying the light, optically coupled to the tunable Bragg grating and disposed in mechanical, thermal, and electrical contact with the spacer layer; and
an electrode disposed on the active waveguide, for providing electrical current thereto.

10. The tunable laser diode of claim 9, wherein the spacer layer comprises a stack of:
a first etch stop layer;
a sacrificial stack comprising first, second, and third sacrificial layers disposed on the first etch stop layer; and
a second etch stop layer disposed on the sacrificial stack, wherein the first gap is disposed between the first and second etch stop layers.

11. The tunable laser diode of claim 10, wherein the first and third sacrificial layers comprise InP, and the second sacrificial layer comprises InGaAs.

12. The tunable laser diode of claim 11, wherein at least one of the first and the third sacrificial layers is thicker than the second sacrificial layer.

13. The tunable laser diode of claim 9,
wherein the first waveguide comprises a ridge waveguide including a stack of:
a first bottom cladding layer supported by the first and second support bars;
a first core layer disposed on the first bottom cladding layer; and
a first top cladding layer disposed on the first core layer, the first top cladding layer having a ridge on top thereof running parallel to the optical axis, for guiding the light along the ridge;
wherein a refractive index of the first core layer is higher than refractive indices of the first top and bottom cladding layers, for confining the light guided by the ridge substantially to the first core layer;
wherein the first resistive heater is disposed on the first top cladding layer, and wherein the openings of the first and second arrays of openings run on respective opposite first and second sides of the ridge; and
wherein the active waveguide comprises a stack of:
a first conductivity type layer supported by the spacer layer, the first conductivity type layer comprising the first bottom cladding layer;
a junction layer supported by the first conductivity type layer, the junction layer comprising the first core layer; and
a second conductivity type layer supported by the junction layer, the second conductivity type layer comprising the first top cladding layer, wherein the ridge runs through the first ridge waveguide and the active waveguide for providing optical coupling therebetween,
wherein the electrode is disposed atop of the second conductivity type layer, for providing electrical current to the active waveguide.

14. The tunable laser diode of claim 13, further comprising a tunable phase section including:
a second substrate section;
third and fourth spaced apart support bars extending upwardly from the second substrate section;
a second ridge waveguide for guiding the light, supported by the third and fourth support bars above the second substrate section, so that a second gap exists between the second substrate section and the second ridge waveguide, the second ridge waveguide comprising a stack of:
a second bottom cladding layer supported by the third and fourth support bars;
a second core layer disposed on the second bottom cladding layer; and
a second top cladding layer disposed on the second core layer, wherein the ridge runs through the second ridge waveguide and the active waveguide for providing optical coupling therebetween; and
wherein a refractive index of the second core layer is higher than the refractive indices of the second top and bottom cladding layers, for confining the light guided by the ridge substantially to the second core layer; and
a second resistive heater disposed on the second top cladding layer, for providing heating of the second ridge waveguide for tuning optical phase of the light propagating therein;
wherein the second ridge waveguide has third and fourth arrays of openings extending therethrough and into the second gap, the openings of the third and fourth arrays of openings running on the respective first and second sides of the ridge, the third and fourth arrays of openings defining third and fourth arrays of heat conducting fingers, respectively, extending from the ridge to the third and fourth support bars, respectively;
wherein the substrate of the tunable laser diode comprises the second substrate section;
wherein the spacer layer of the tunable laser diode comprises the third and fourth support bars;
wherein the first conductivity type layer of the tunable laser diode comprises the second bottom cladding layer;
wherein the junction layer of the tunable laser diode comprises the second core layer; and
wherein the second conductivity type layer of the tunable laser diode comprises second top cladding layer.

15. The tunable laser diode of claim 14, wherein the first and second ridge waveguides and the active waveguide comprise a single monolithic waveguide structure.

16. The tunable laser diode of claim 15, wherein the first and second gaps extend completely through the first and second substrate sections, respectively.

17. Use of bulk micromachining to make the first and second gaps of the tunable laser diode of claim 16.

18. Use of bulk micromachining to make the first gap of the tunable Bragg grating of claim 5.

19. Use of micromachining to make the first gap of the tunable Bragg grating of claim 1.

20. A method for tuning a laser diode having an active waveguide, the method comprising:
(a) providing a tunable Bragg grating having a substrate, first and second spaced apart support bars extending upwardly from the substrate, and a first waveguide optically coupled to the active waveguide, wherein the first waveguide has an optical axis and is supported by the first and second support bars above the substrate, forming a gap between the substrate and the first waveguide, wherein an effective refractive index of the first waveguide is spatially modulated along the optical axis, forming a grating for reflecting an optical frequency component of the light guided by the first waveguide to propagate back therein, wherein at least one of phase or amplitude of the spatial modulation of the effective refractive index is varying along the optical axis, forming modulation crests and valleys, wherein the crests are spaced apart at a first spatial frequency along the optical axis;
(b) providing first and second arrays of openings extending through the first waveguide and into the gap, the openings of the first and second arrays of openings running on respective opposite first and second sides of the optical axis, the first and second arrays of openings defining first and second arrays of heat conducting fingers, respectively, extending from the optical axis towards the first and second support bars, respectively;
wherein step (b) comprises disposing the openings so that positions of the heat conducting fingers along the optical axis are coordinated with positions of the modulation crests and valleys along the optical axis; and
(c) heating the first waveguide for tuning the optical frequency of the optical frequency component, thereby tuning the laser diode.

21. The method of claim 20, wherein step (b) comprises disposing the openings so that the first and second arrays of heat conducting fingers are disposed at a second spatial frequency along the optical axis, wherein the second spatial frequency is an integer multiple of the first spatial frequency.

* * * * *